US012721130B2

(12) United States Patent
Waidhas et al.

(10) Patent No.: US 12,721,130 B2
(45) Date of Patent: Aug. 25, 2026

(54) DUAL-SIDED TERMINAL DEVICE WITH SPLIT SIGNAL AND POWER ROUTING

(71) Applicant: Intel Corporation, Santa Clara, CA (US)

(72) Inventors: Bernd Waidhas, Pettendorf (DE); Jan Proschwitz, Riesa (DE); Stefan Reif, Munich (DE); Vishnu Prasad, Munich (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 17/708,968

(22) Filed: Mar. 30, 2022

(65) Prior Publication Data

US 2023/0317562 A1 Oct. 5, 2023

(51) Int. Cl.

| | |
|---|---|
| ***H10W 20/20*** | (2026.01) |
| ***H10W 70/05*** | (2026.01) |
| ***H10W 70/60*** | (2026.01) |
| ***H10W 70/652*** | (2026.01) |
| ***H10W 72/00*** | (2026.01) |

(Continued)

(52) U.S. Cl.

CPC ......... *H10W 20/20* (2026.01); *H10W 72/019* (2026.01); *H10W 72/072* (2026.01); *H10W 70/05* (2026.01); *H10W 70/60* (2026.01); *H10W 70/652* (2026.01); *H10W 72/248* (2026.01);

(Continued)

(58) Field of Classification Search

CPC ....... H01L 23/481; H01L 24/03; H01L 24/06; H01L 24/14; H01L 24/16; H01L 24/81; H10W 20/20; H10W 72/072; H10W 72/019; H10W 72/967; H10W 72/944; H10W 90/724; H10W 72/248; H10W 70/05; H10W 70/60

See application file for complete search history.

(56) References Cited

U.S. PATENT DOCUMENTS

| | | | | |
|---|---|---|---|---|
| 2008/0029884 A1* | 2/2008 | Grafe | H01L 23/5385 257/E25.023 |
| 2020/0091072 A1* | 3/2020 | Naser | H01L 23/5226 |

(Continued)

OTHER PUBLICATIONS

Extended European Search Report from European Patent Application No. 23153060.1 notified Jul. 31, 2023, 8 pgs.

(Continued)

*Primary Examiner* — Christine A Enad

(74) *Attorney, Agent, or Firm* — Essential Patents Group, LLP

(57) ABSTRACT

A die package comprises a semiconductor die comprising a first face, a second face on an opposing second side, an active layer located between the first face and the second face, a first electrical pathway between the first face and the active layer, a second electrical pathway between the second face and the active layer, a first contact pad coupled to the first face and electrically connected to the first electrical pathway, and a second contact pad coupled to the second face and electrically connected to the second electrical pathway. In an example, the first electrical pathway is configured to transmit one or more signals between the first contact pad and the active layer and the second electrical pathway is configured to transmit electrical power between the second contact pad and the active layer.

27 Claims, 4 Drawing Sheets

(51) Int. Cl.
*H10W 72/20* (2026.01)
*H10W 72/90* (2026.01)
*H10W 90/00* (2026.01)

(52) U.S. Cl.
CPC ........ *H10W 72/944* (2026.01); *H10W 72/967* (2026.01); *H10W 90/724* (2026.01)

(56) References Cited

U.S. PATENT DOCUMENTS

| | | | | |
|---|---|---|---|---|
| 2020/0168559 | A1 | 5/2020 | Cheah et al. | |
| 2021/0343650 | A1* | 11/2021 | Peng | H01L 25/0652 |
| 2021/0366874 | A1* | 11/2021 | Choi | G11C 5/025 |
| 2022/0108934 | A1* | 4/2022 | Tain | H01L 25/072 |
| 2022/0302089 | A1* | 9/2022 | Rusu | H01L 25/18 |

OTHER PUBLICATIONS

Office Action from European Patent Application No. 23153060.1 notified Apr. 16, 2026, 6 pgs.

* cited by examiner

DUAL-SIDED TERMINAL DEVICE WITH SPLIT SIGNAL AND POWER ROUTING

TECHNICAL FIELD

Embodiments described herein generally relate to electrical connections in electronic devices. More specifically, embodiments described herein relate to improved signal and electrical power supply routing to one or more active layers of a semiconductor die.

BACKGROUND

Semiconductor dies may include one or more signal routing pathways to route instruction signals between the active layer of the semiconductor die and signal contact pads. Similarly, the semiconductor die can also include one or more electrical power routing pathways to route electrical power from power contact pads to the active layer. The signal contact pads and power contact pads are located on the same side of the semiconductor die, requiring a relatively large area on the semiconductor die for the formation of the signal routing pathways and the electrical power routing pathways, crosstalk management, and compromises in the layout of the semiconductor die during the design stage.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present application, in one or more embodiments, relates to routing of signals and or electrical power to one or more active layers of a semiconductor die. Recently, the development of backside power or signal supply layers has provided for the vertical separation of signal and power routing to opposite sides of the one or more transistors that make up the active layer or layers in semiconductor dies. However, the advantages of this vertical separation between the signal and electrical power routing are diminished by the die still requiring both the signal and power terminals (e.g., contact pads and solder bumps) to be located on the same side of the die so that both the signals and power can be provided to the die from a common substrate to which the die is mounted. The same-side terminals still require a relatively large die area to accommodate the vias to route either the signals or power from one side of the active layer to the opposite side of the active layer and to accommodate the contact pads and solder balls. The routing of both the signals and power on the same side can also require compromises in the layout design of the die, such as varying layer thicknesses or other design choices, as well as the potential need for greater cross-talk management.

Figure 1:
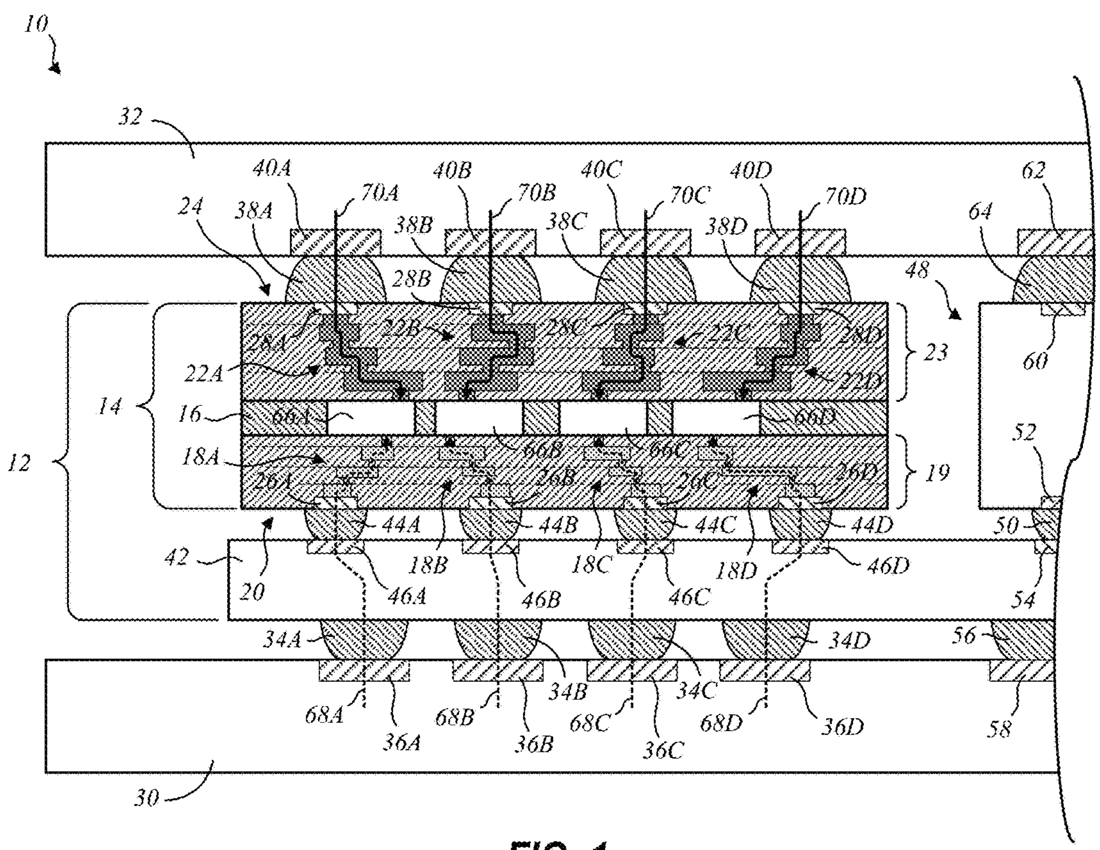
FIG. 1 is a cross-sectional plan view of an electronic die package with dual-sided signal and electrical power routing with signal routing pathways on a first side of a semiconductor die and electrical power supply pathways on an opposing second side of the semiconductor die, wherein the semiconductor die is coupled to opposing signal supply and power supply circuit boards to form an electronic device, in accordance with some example embodiments.

FIG. 1 illustrates an electronic device 10 that provides for a solution for these problems via the use of a die package 12 that includes a "dual-sided" semiconductor die 14 that provides for signal routing between one or more active layers 16 to a first side of the die 14 and for electrical power routing to the one or more active layers 16 from an opposing second side of the die 14. Specifically, the semiconductor die 14 includes one or more first electrical pathways 18A, 18B, 18C, 18D located on a first side of the active layer 16 that electrically connect the active layer 16 to a first face 20 of the semiconductor die 14 (which may also be referred to as the "front face 20"). The semiconductor die 14 also includes one or more second electrical pathways 22A, 22B, 22C, 22D located on a second side of the active layer 16 that is opposite the first side, wherein the second electrical pathways 22 electrically connect the active layer 16 to a second face 24 of the semiconductor die 14 that opposes the first face 20 (which may also be referred to as the "back face 24"). Although the present application may use the terms "front" and "back" to refer to the relative positions of the signal routing and electrical power routing in the semiconductor die 14, those having skill in the art will appreciate that the orientation shown in FIG. 1 may be flipped, e.g., such that the power supply pathways 22 can electrically connect the active layer 16 to the front face 20 and the signal pathways 18 can electrically connect the active layer 16 to the back face 24.

In an example, the one or more first electrical pathways 18 are each configured to transmit one or more signals from the front face 20 to the active layer 16 and are, therefore, also referred to herein as "signal pathways 18." Similarly, in an example, the one or more second electrical pathways 22 are each configured to supply electrical power from the back face 24 to the active layer 16 and are, therefore, also referred to herein as "power supply pathways 22."

In an example, the one or more signal pathways 18 are formed by one or more signal routing layers 19 (shown conceptually in FIG. 1 by the dashed lines on the front side of the active layer 16) that are built up to form layers of the semiconductor die 14 on a first side (i.e., the front side) of the one or more active layers 16. In an example, the one or more signal routing layers 19 are metalized layers, as is known in the art, wherein the metalized layers 19 are patterned to form vias through the semiconductor die 14 made out of metal or other electrically conductive material, wherein the vias in the metalized signal routing layers 19 provide for the electrically conductive pathway that forms the signal pathways 18. Similarly, in an example, the one or more power supply pathways 22 are formed by one or more power routing layers 23 (shown conceptually in FIG. 1 by the dashed lines on the back side of the active layer 16) that are built up on a second side of the one or more active layers 16 that opposes the first side (i.e., the back side of the one or more active layers 16). In an example, the one or more power routing layers 23 are metalized layers, as is known in the art, wherein the metalized layers 23 are patterned to form vias through the semiconductor die 14 made out of metal or other electrically conductive material, wherein the vias in the metalized power routing layers 23 provide for the electrically conductive pathway that forms the signal pathways 18.

The semiconductor die 14 can also include one or more first contact pads 26A, 26B, 26C, and 26D (collectively referred to as "first contact pads 26" or "first contact pad 26") coupled to the first face 20 and one or more second contact pads 28A, 28B, 28C, 28D (collectively referred to as "second contact pads 28" or "second contact pad 28") coupled to the second face 24. The first contact pads 26 are electrically connected to the active layer 16 by the signal pathways 18 and, therefore, the first contact pads 26 may also be referred to as "signal contact pads 26." The second contact pads 28 are electrically connected to the active layer 16 by the power supply pathways 22 and, therefore, the second contact pads 28 may also be referred to as "power contact pads 28." In an example, each of the signal pathways 18 are electrically coupled to a corresponding signal contact pad 26, e.g., with a first signal contact pad 26A being electrically coupled to a first signal pathway 18A, a second signal contact pad 26B being electrically coupled to a second signal pathway 18B, a third signal contact pad 26C being electrically coupled to a third signal pathway 18C, and a fourth signal contact pad 26D being electrically coupled to a fourth signal pathway 18D. Similarly, in an example, each of the power supply pathways 22 are electrically coupled to a corresponding power contact pad 28, e.g., with a first power contact pad 28A being electrically coupled to a first power supply pathway 22A, a second power contact pad 28B being electrically coupled to a second power supply pathway 22B, a third power contact pad 28C being electrically coupled to a third power supply pathway 22C, and a fourth power contact pad 28D being electrically coupled to a fourth power supply pathway 22D.

In an example, the electronic device 10 includes a pair of circuit boards 30, 32 to which the semiconductor die 14 is electrically connected. A first circuit board 30 is configured to route the one or more signals that are intended to be received by the active layer 16 to the first contact pads 26 so that the one or more signals can be passed to the active layer 16 by the signal pathways 18. For this reason, the first circuit board 30 may also be referred to as the "signal circuit board 30." A second circuit board 32 is configured to route the electrical power that is intended to be received by the active layer 16 to the second contact pads 28 so that the electrical power can be passed to the active layer 16 by the power supply pathways 22. For this reason, the second circuit board 32 may also be referred to as the "power circuit board 32."

In an example, the electronic device 10 includes one or more first electrical connection structures (also referred to simply as "first electrical connections") that electrically connect the first circuit board 30, either directly or indirectly, to the first contact pads 26 such that the first electrical connections provide a conductive pathway for the one or more signals to pass from the first circuit board 30 to the first contact pads 26 and then onto the active layer 16 via the signal pathways 18, or that can pass signals that had been sent by the active layer 16 via the signal pathways 18 from the first contact pads 26 to the first circuit board 30. Similarly, the electronic device 10 also includes one or more second electrical connection structures (also referred to simply as "second electrical connections") that electrically connect the second circuit board 32, either directly or indirectly, to the second contact pads 28 such that the second electrical connections provide a conductive pathway for the electrical power to pass from the second circuit board 32 to the second contact pads 28 and then onto the active layer 16 via the power supply pathways 22.

In an example, the first electrical connections between the first circuit board 30 and the first contact pads 26 can include one or more first solder interconnects 34A, 34B, 34C, 34D (collectively referred to as "first solder interconnects 34" or simply as "first interconnects 34"), which are each electrically coupled to a corresponding first interconnect contact pad 36A, 36B, 36C, 36D on the first circuit board 30 (collectively referred to as "interconnect contact pads 36" or simply as "interconnect pads 36"). Because the first interconnects 34 and the first interconnect pads 36 pass the one or more signals to or from the signal contact pads 26 in the example shown in FIG. 1, the first interconnects 34 may also be referred to as "signal interconnects 34" and the first interconnect pads 36 may also be referred to as "signal interconnect pads 36."

In an example, the second electrical connections between the second circuit board 32 and the second contact pads 28 can include one or more second solder interconnects 38A, 38B, 38C, 38D (collectively referred to as "second solder interconnects 38" or simply as "second interconnects 38"), which can each be electrically coupled to a corresponding second interconnect contact pad 40A, 40B, 40C, 40D on the second circuit board 32 (collectively referred to as "second interconnect contact pads 40" or simply as "second interconnect pads 40." Because the second interconnects 36 and the second interconnect pads 40 pass electrical power to the power contact pads 28 in the example shown in FIG. 1, the second interconnects 36 may also be referred to as "power interconnects 36") and the second interconnect pads 40 may also be referred to as "power interconnect pads 40."

In an example, each of the signal interconnects 34 and corresponding signal interconnect pads 36 are electrically connected, either directly or indirectly, to a corresponding signal contact pad 26 on the semiconductor die 14, e.g., with a first signal interconnect 34A and signal interconnect pad 36A being electrically connected, either directly or indirectly, to the first signal contact pad 26A, a second signal interconnect pad 36B and signal interconnect pad 36B being electrically connected, either directly or indirectly, to the second signal contact pad 26B, a third signal interconnect 34C and signal interconnect pad 36C being electrically connected, either directly or indirectly, to the third signal contact pad 26C, and a fourth signal interconnect 34D and signal interconnect pad 36D being electrically connected, either directly or indirectly, to the fourth signal contact pad 26D. Similarly, in an example, each of the power interconnects 38 and corresponding power interconnect pads 40 are electrically connected, either directly or indirectly, to a corresponding power contact pad 28 on the semiconductor die 14, e.g., with a first power interconnect 38A and power interconnect pad 40A being electrically connected, either directly or indirectly, to the first power contact pad 28A, a second power interconnect 38B and power interconnect pad 40B being electrically connected, either directly or indirectly, to the second power contact pad 28B, a third power interconnect 38C and power interconnect pad 40C being electrically connected, either directly or indirectly, to the third power contact pad 28C, and a fourth power interconnect 38D and power interconnect pad 40D being electrically connected, either directly or indirectly, to the fourth power contact pad 28D.

In an example, either the first electrical connections or the second electrical connections can include one or more additional structures associated with either of the first and second circuit boards 30, 32 or with the die package 12, or both. For example, the die package 12 can include a die package substrate 42 (also referred to simply as "the substrate 42"), which can form part of either the one or more first electrical connections between the first circuit board 30 and the first face 20 of the die 14 or of the one or more second electrical connections between the second circuit board 32 and the second face 24 of the die 14. In the example shown in FIG. 1, the first face 20 of the semiconductor die 14 is coupled to the substrate 42 with one or more solder joints 44A, 44B, 44C, 44D (collectively referred to as "solder joints 44") that are each electrically coupled to a corresponding substrate solder pad 46A, 46B, 46C, 46D (collectively referred to as "substrate pads 46") and to a corresponding one of the one or more signal contact pads 26. However, those having skill in the art will appreciate that the substrate 42 can be configured to be coupled to the power contact pads 28 on the second face 24 of the die 14 without varying from the scope of the present application. In the example shown in FIG. 1, a first solder joint 44A and substrate pad 46A are electrically coupled to the first signal contact pad 26A, a second solder joint 44B and substrate pad 46B are electrically coupled to the second signal contact pad 26B, a third solder joint 44C and substrate pad 46C are electrically coupled to the third signal contact pad 26C, and a fourth solder joint 44D and substrate pad 46D are electrically coupled to the fourth signal contact pad 26D. Each substrate pad 46 on the top side of the substrate 42 can be electrically connected to a corresponding contact pad on the bottom side of the substrate 42 (not shown) by one or more internal structures in the substrate 42, such as vias or other known interconnect structures (not shown). In an example, the bottom-side contact pads on the substrate 42 can be electrically coupled to the signal circuit board 30 by the one or more signal interconnects 34.

The inclusion of the substrate 42 as part of the die package 12 allows the die package 12 to include additional semiconductor dies in addition to the semiconductor die 14 shown as the main component in FIG. 1. For example, as shown in FIG. 1, the die package 12 can include a second semiconductor die 48 that is also electrically coupled to the substrate 42, e.g., with one or more solder joints 50 that each electrically couple a corresponding signal contact pad 52 on a front face of the second semiconductor die 48 to a solder pad 54 on the substrate 42. The substrate 42 can be further electrically coupled to the signal circuit board 30 with one or more signal interconnects 56 and signal interconnect pads 58 that can each correspond to a corresponding one of the substrate pads 54 and solder joints 50. The second semiconductor die 48 can also include one or more power contact pads 60 on an opposing back face that are each electrically connected to a corresponding power interconnect pad 62, such as with a corresponding power interconnect 64. The structures of the second semiconductor die 48 can be similar or identical to the corresponding structures described above with respect to the first semiconductor die 14. For example, the solder joints 50 can be similar or identical to the solder joints 44, the contact pads 52, 60 can be similar or identical to the contact pads 26, 28, the substrate pads 54 can be similar or identical to the substrate pads 46, the interconnects 56, 64 can be similar or identical to the interconnects 34, 38, and the interconnect pads 58, 62 can be similar to identical to the interconnect pads 36, 40. Similarly, the second semiconductor die 48 can include its own active layer or layers (not shown in FIG. 1) and corresponding signal pathways and power supply pathways (not shown) that route one or more signals and electrical power, respectively, to the active layer or layers of the second semiconductor die 48.

In an example, each semiconductor die 14, 48 comprises one of any type of microelectronic device including, but not limited to, integrated circuits (ICs), chips, chip sets, memory devices, processors, such as a central processing unit (CPU), a graphics processing unit (GPU), accelerated processing unit (APU), or combinations thereof.

Although not shown in FIG. 1, the second side of the semiconductor die 14, e.g., the side through which electrical power is fed and routed, can be coupled to a die substrate that is similar to the substrate 42 on the signal side of the semiconductor die 14. In other words, instead of the power contact pads 28 being directly coupled to the power circuit board 32 with the power interconnects 38, the power contact pads 28 could be coupled to a power supply substrate with one or more solder joints that are similar or identical to the solder joints 44 that couple the substrate 42 to the signal contact pads 26. Similarly, the power side of the second semiconductor die 48 could be coupled to the second power supply substrate rather than being directly coupled to the power circuit board 32 with the power interconnect 64.

In an example, each of the one or more active layers 16 can include one or more transistors 66A, 66B, 66C, 66D (collectively referred to as "transistors 66"), wherein each transistor 66 is configured to perform one or more actions. For example, if the semiconductor die 14 is a processor such as a CPU, the one or more transistors 66 can perform processing functions, as will be understood by those in the art. In an example, each transistor 66 in the one or more active layers 16 is electrically coupled to a corresponding signal pathway 18 on a first side of the transistor 66 (i.e., a front side of the transistor 66). For example, a first transistor 66A can be electrically coupled to the first signal pathway 18A, a second transistor 66B can be electrically coupled to the second signal pathway 18B, a third transistor 66C can be electrically coupled to the third signal pathway 18C, and a fourth transistor 66D can be electrically coupled to the fourth signal pathway 18D. In this way, each transistor 66 can have a dedicated path for one or more signals (also referred to as a "signal path"), wherein the signal path runs from the signal circuit board 30 to the transistor 66. For example, one or more first signals that are designated to be received by the first transistor 66A can pass along a first signal path 68A that begins in the signal circuit board 30 where it is passed to the first signal interconnect pad 36A, then to the first signal interconnect 34A, wherein it passes into the substrate 42 to the first substrate pad 46A and into the first solder joint 44A, then into the first signal contact pad 26A, and through the first signal pathway 18A, which feeds into or out of the first transistor 66A. Similar signal paths 68B, 68C, 68D can be provided for signals destined for or originating from each of the other transistors 66B, 66C, 66D in the one or more active layers 16. Those having skill in the art will appreciate that there can be more than one signal path for one or more of the transistors 66, and that the single signal path 68 shown for each of the four transistors 66A, 66B, 66C, 66D in FIG. 1 and described above is merely to show a simple example.

Similarly, each transistor 66 in the one or more active layers 16 can be electrically coupled to a corresponding power supply pathway 22. In an example, each transistor 66 is electrically coupled to its corresponding power supply pathway 22 on an opposite side of the transistor 66 from the side that is electrically coupled to the corresponding signal pathway 18 (i.e., a back side of the transistor 66 when the corresponding signal pathway 18 is electrically coupled to the front side). For example, the first transistor 66A can be electrically coupled to the first power supply pathway 22A, the second transistor 66B can be electrically coupled to the second power supply pathway 22B, the third transistor 66C can be electrically coupled to the third power supply pathway 22C, and the fourth transistor 66D can be electrically coupled to the fourth power supply pathway 22D. In this way, each transistor 66 can have a dedicated path for supplying electrical power to the transistor 66 (also referred to as a "power supply path"), wherein the power supply path runs from the power circuit board 32 to the transistor 66. For example, a first electrical power supply that is designated to power the first transistor 66A can pass along a first power supply path 70A that begins at the power circuit board 32 where it is passed to the first power interconnect pad 40A, then to the first power interconnect 38A wherein it passes into the first power contact pad 28A, and through the first power supply pathway 22A, which feeds into the first transistor 66A. Similar power supply paths 70B, 70C, 70D can be provided for supplying electrical power to each of the other transistors 66B, 66C, 66D in the one or more active layers 16. Those having skill in the art will appreciate that there can be more than one power supply path for one or more of the transistors 66, and that the single power supply path 70 shown for each of the four transistors 66A, 66B, 66C, 66D in FIG. 1 and described above is merely to show a simple example.

The semiconductor die 14 with dual-sided signal and power routing as described above can provide for several advantages over previous conventional dies that had dual-side signal and power supply into the active layer but that still included the terminals (e.g., contact pads) for both signal and electrical power on the same side of the die chip. These advantages will be illustrated by a comparison of the electronic device 10 with the dual-sided semiconductor die 14 of FIG. 1 with a comparative electronic device 80 in FIG. 2 that includes a conventional semiconductor die 82 (referred to hereinafter as "the comparative semiconductor die 82") with both the signal and electrical power terminals on the same side of the semiconductor die 82. Similar to the dual-sided semiconductor die 14 of FIG. 1, the comparative semiconductor die 82 includes one or more active layers 84, which can be similar or identical to the one or more active layers 16 in the semiconductor die 14 of FIG. 1. For example, each of the one or more active layers 84 can include one or more transistors 86A, 86B, 86C (collectively referred to as "transistors 86"), which can be similar or identical to the transistors 66 of the semiconductor die 14.

Like the semiconductor die 14 shown in FIG. 1, the comparative semiconductor die 82 can include a first face 88 on a first side of the comparative semiconductor die 82 and a second face 90 on a second side of the comparative semiconductor die 82 that opposes the first side of the first face 88 (which will also be referred to as the front face 88 on the front side of the die 82 and as the back face 90 on the back side of the die 82). However, unlike the dual-sided die 14 of FIG. 1, the comparative semiconductor die 82 only includes contact pads on one side of the die 82, such as only on the front face 88 in the example shown in FIG. 2. Specifically, the comparative semiconductor die 82 includes both a first set of one or more first contact pads 92A, 92B, 92C (collectively referred to as "first contact pads 92") and a second set of one or more second contact pads 94A, 94B, 94C (collectively referred to as "second contact pads 94"). In an example, the first contact pads 92 configured for receiving one or more signals to or from the one or more active layers 84 such that the first contact pads 92 will also be referred to as "signal contact pads 92." Similarly, in an example, the one or more second contact pads 94 can be configured for receiving electrical power to be supplied to the one or more active layers 84 such that the second contact pads 94 will also be referred to as "power contact pads 94."

Figure 2:
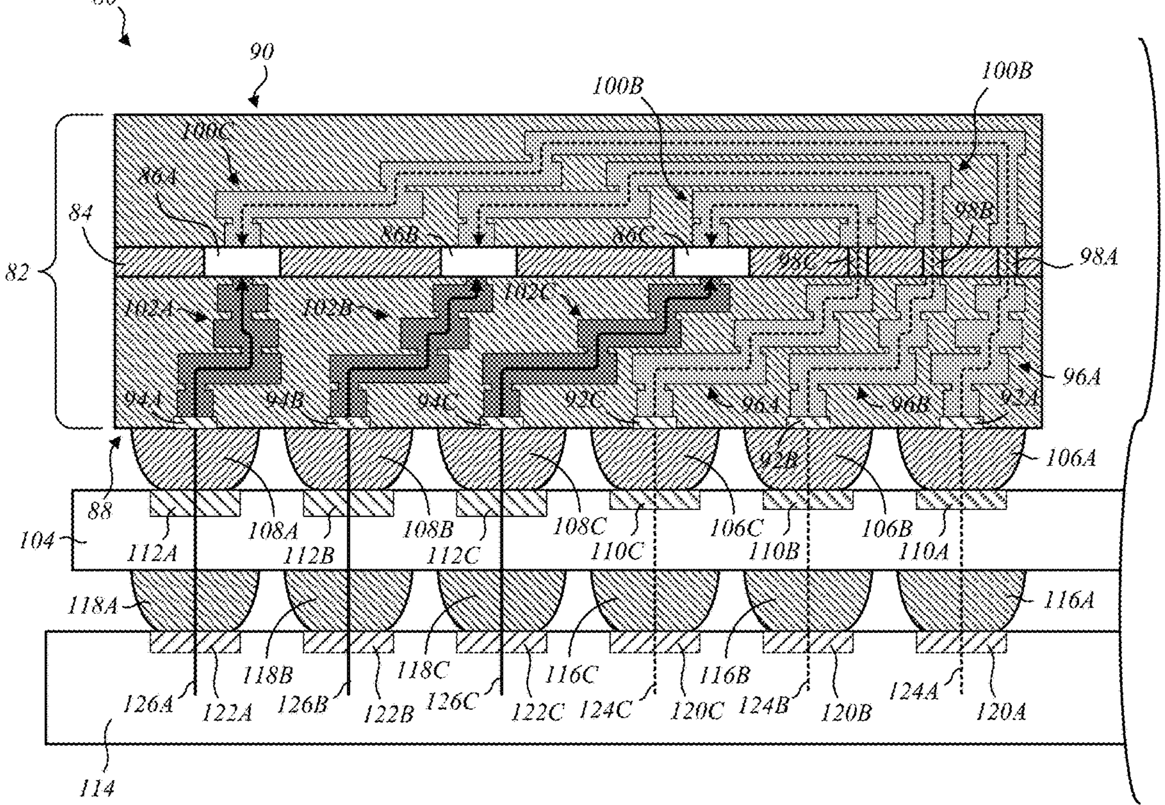
FIG. 2 is a cross-sectional plan view of a comparative electronic die package wherein both signal routing and electrical power supply routing are on the same side of a comparative semiconductor die, wherein the comparative semiconductor die is coupled to a comparative circuit board to form a comparative electronic device.

The comparative semiconductor die 82 also includes one or more first pathways through the die 82 that provide a conductive pathway for the transmission of one or more signals between the signal contact pads 92 and the active layer 84 and or more second pathways through the die 82 that provide a conductive pathway for the supply of electrical power to the active layer 84 from the power contact pads 94. However, since both the signal contact pads 92 and the power contact pads 94 are on the same side of the die 82, one of the first pathways or the second pathways must be routed from the front side of the active layer 84, where the contact pads 92, 94 are located, to the back side of the active layer 84. In the example shown in FIG. 2, the first pathways for the one or more signals are configured so that they pass from the front side through the one or more active layers 84 to the back side so that the one or more signals can be transmitted to or from the back side of the active layer 84 (e.g., to or from the back side of each of the transistors 86). Therefore, in an example, the first pathways include one or more front-side signal pathways 96A, 96B, 96C (collectively referred to as "front-side signal pathways 96"), one or more corresponding vias 98A, 98B, 98C (collectively referred to as "vias 98") that pass through the one or more active layers 84, and one or more corresponding back-side signal pathways 100A, 100B, 100C (collectively referred to as "back-side signal pathways 100"). As can be seen in FIG. 2, in an example, each of these collective pathways can correspond to one of the transistors 86 so that each collective pathway can transmit one or more signals between a corresponding signal contact pad 92 and the corresponding transistor 86. For example, a first front-side signal pathway 96A, first via 98A, and first back-side signal pathway 100A can transmit signals between a first signal contact pad 92A and a first transistor 86A; a second front-side signal pathway 96B, second via 98B, and second back-side signal pathway 100B can transmit signals between a second signal contact pad 92B and a second transistor 86B; and a third front-side signal pathway 96C, third via 98C, and third back-side signal pathway 100C can transmit signals between a third signal contact pad 92C and a third transistor 86C.

Also, in the example shown in FIG. 2, the second pathways that transmit electrical power to the one or more active layers 84 only need to be located on the front side of the active layer 84, such that they only need to include one or more power supply pathways 102A, 102B, 102C (collectively referred to as "power supply pathways 102"). As can be seen in FIG. 2, in an example, each of the power supply pathways 102 can correspond to one of the transistors 86 so that each power supply pathway 102 can transmit electrical power from a corresponding power contact pad 94 to the corresponding transistor 86. For example, a first power supply pathway 102A can transmit electrical power from a first power contact pad 94A to the first transistor 86A; a second power supply pathway 102B can transmit electrical power from a second power contact pad 94B to the second transistor 86B; and a third power supply pathway 102C can transmit electrical power from a third power contact pad 94C to the third transistor 86C.

Similar to the electronic device 10 of FIG. 1, the comparative electronic device 80 can include a substrate 104 to which the comparative semiconductor die 82 is electrically coupled. Additional semiconductor dies beyond the comparative semiconductor die 82 (not shown) can be coupled to the substrate 104 for inclusion in the same comparative electronic device 80. In an example, the comparative semiconductor die 82 is electrically coupled to the substrate 104 with one or more solder joints that correspond to each of the contact pads 92 and 94. For example, a first set of solder joints 106A, 106B, 106C (collectively "first solder joints 106") can correspond to the signal contact pads 92, such that the first solder joints 106 may also be referred to as the "signal solder joints 106"). A second set of solder joints 108A, 108B, 108C (collectively "second solder joints 108") can correspond to the power contact pads 94, such that the second solder joints 108 may also be referred to as the "power solder joints 108"). The signal solder joints 106 are also electrically coupled to a corresponding set of first solder pads 110A, 110B, 110C (collectively "first solder pads 110") that will also be referred to as the "signal solder pads 110." Similarly, the power solder joints 108 are also electrically coupled to a corresponding set of second solder pads 112A, 112B, 112C (collectively "second solder pads 112") that will also be referred to as the "power solder pads 112."

The substrate 104 can be coupled to a circuit board 114 that is configured to route both the one or more signals and the electrical power to or from the one or more active layers 84 of the comparative semiconductor die 82. In an example, the substrate 104 is electrically coupled to the circuit board 114 by interconnects corresponding to both the one or more signals and the electrical power. For example, a first set of one or more first interconnects 116A, 116B, 116C (collectively the "first interconnects 116") corresponds to the signal solder pads 110, the signal solder joints 106, the signal contact pads 92, the front-side signal pathways 96, the signal vias 98, and the back-side signal pathways 100, such that the first interconnects will also be referred to as the "signal interconnects 116." A second set of one or more second interconnects 118A, 118B, 118C (collectively the "second interconnects 118") correspond to the power solder pads 112, the power solder joints 108, the power contact pads 94, and the power supply pathways 102, such that the second interconnects 118 will also be referred to as the "power interconnects 118." Each of the interconnects 116, 118 are electrically coupled to a corresponding interconnect pad on the circuit board 114, e.g., with each of the signal interconnects 116 being electrically coupled to a corresponding signal interconnect pad 120A, 120B, 120C (collectively referred to as the "signal interconnect pads 120") and each of the power interconnects 118 being electrically coupled to a corresponding power interconnect pad 122A, 122B, 122C (collectively referred to as the "power interconnect pads 122").

The structures of the comparative electronic device 80 work together to form overall signal paths 124A, 124B, 124C (collectively "signal paths 124") that allow one or more signals to be transmitted to or from the one or more active layers 84 and power supply paths 126A, 126B, 126C (collectively "power supply paths 126") that allow electrical power to be supplied to the one or more active layers 84. Similar to the paths 68 and 70 described above for the electronic device 10 of FIG. 1, in an example, each signal path 124 can each power supply path 126 can correspond to one of the transistors 86 of the one or more active layers 84. For example, one or more first signals that are designated to be received by the first transistor 86A can pass along a first signal path 124A that begins in the circuit board 114 where it is passed to a first signal interconnect pad 120A, then to a first signal interconnect 116A, wherein it passes into the substrate 104 to a first signal solder pad 110A and into a first signal solder joint 106A, then into a first signal contact pad 92A, through a first front-side signal pathway 96A to a first via 98A, and through a first back-side signal pathway 100A which feeds into or out of the first transistor 86A. Similar signal paths 124B and 124C can be provided for signals destined for or originating from each of the other transistors 86B, 86C in the active layer 84. Similarly, a first electrical power supply that is designated to power the first transistor 86A can pass along a first power supply path 126A that begins at the circuit board 114 where it is passed to a first power interconnect pad 122A, then to a first power interconnect 118A wherein it passes into the substrate 104 where it is routed to a first power solder pad 112A, then to a first power solder joint 108A and into a first power contact pad 94A where it then flows into and through a first power supply pathway 102A, which feeds into the first transistor 86A. Similar power supply paths 126B, 126C can be provided for supplying electrical power to each of the other transistors 86B, 86C in the active layer 84.

One of the primary advantages of the dual-sided semiconductor die 14 of the present disclosure is that it allows the semiconductor die 14 to have a reduced die area when compared to a similarly-functioned die where both the signal and power terminals are on the same side of the die, such as with the comparative semiconductor die 82. For example, in the comparative semiconductor die 82, a portion of the layer or layers on the front side of the active layer 84 must be taken up by both signal routing, in the form of the front-side signal pathways 96, and by power supply routing, in the form of the power supply pathways 102. By comparison, in the dual-sided semiconductor die 14 of the present disclosure, the front-side layer or layers of the semiconductor die 14 are only taken up by signal routing in the form of the signal pathways 18. The power routing, i.e., the power supply pathways 22, are moved to the back-side layer or layers such that the same surface area of the semiconductor die 14 can be dedicated to both signal routing (e.g., in the front-side layers) and power routing (e.g., in the back-side layers).

In addition, in the dual-sided die 14, there is no need for vias through the one or more active layers 16 to pass either signals or electrical power from a front side to a back side of the one or more active layers 16 or vice versa, as with the signal vias 98 in the comparative semiconductor die 82 that transmit signals across the active layer 84 from the front side to the back side of the comparative die 82. The vias 98 take up additional die area in the comparative semiconductor die 82 that does not need to be used up in the dual-sided semiconductor die 14 of the present disclosure.

Also, as will be appreciated by those having skill in the art, solder joints that are configured to carry electrical power into a die are typically required to be larger than those that are required for signals. However, it is not economically practical to design a die-making process that forms solder balls of differing sizes on the same side of the die, as would be required when forming the signal solder joints 106 and the power solder joints 108 for coupling the comparative semiconductor die 82 to the substrate 104 in the comparative electronic device 80. But, since the signal solder joints 44 and the power interconnects 38 for coupling the dual-sided semiconductor die 14 to a substrate 42 and/or to a circuit board 30, 32 are formed on opposite sides of the semiconductor die 14, they can have different sizes such that the solder joints 44 that are coupled to the signal contact pads 26 can be smaller than the power interconnects 38 that are coupled to the power contact pads 28. In contrast, in the comparative semiconductor die 82, both the signal solder joints 106 and the power solder joints 108 are the same size, which means that the signal solder joints 106 are actually larger than they need to be, taking up more surface area on the front side of the comparative semiconductor die 82 then is taken up by the signal solder joints 44 on the front side of the dual-sided semiconductor die 14 of the present disclosure.

Further, one or both of the signal pathways 18 and the power supply pathways 22 can be less complicated and therefore can take up less die area when both are not required to begin on the same side of the semiconductor die 14. For example, because the signal pathways 18 in the dual-sided die 14 do not have to route to vias that are separate from the transistors 66, the signal pathways 18 can be smaller than is required for the front-side signal pathways 96 in the comparative semiconductor die 82, taking up less die area.

The resulting smaller die area of the dual-sided semiconductor die 14 of the present disclosure compared to the comparative semiconductor die 82 is depicted conceptually in FIGS. 1 and 2, which show the dual-sided semiconductor die 14 taking up a smaller cross-sectional area in FIG. 1 compared to that taken up by the comparative semiconductor die 82 in FIG. 2. In addition, even though it takes up a smaller overall die area, the dual-sided semiconductor die 14 is able to incorporate four total transistors 66A, 66B, 66C, and 66D in its active layer 16 compared to only three transistors 86A, 86B, and 86C that the comparative semiconductor die 82 is able to accommodate. For example, as can be seen in FIG. 1, the structural configuration of the dual-sided semiconductor die 14 can allow the transistors 66 in the active layer 16 of the die 14 to be more densely packed together for more efficient use of the die area than can be achieved for the transistors 86 in the active layer 84 of the comparative semiconductor die 82.

Moreover, as noted above, routing both signal and power on the same side of the die, as with the comparative semiconductor die 82, may require compromises in design layout, for example to accommodate both the front-side signal pathways 96 and the power supply pathways 102 on the same side. Also, the comparative electronic device 80 may need to include more cross-talk management and mitigation structures to avoid cross talk between the front-side signal pathways 96 and the power supply pathways 102 which is not required for the dual-sided semiconductor die 14 because the signal pathways 18 and power supply pathways 22 are vertically separated on opposite sides of the one or more active layers 16. In addition, the signal pathways 18 can be more efficiently spaced apart in the front-side layers 19 of the dual-sided die 14 than can be achieved with the front-side signal pathways 96 and/or the back-side signal pathways 100 in the comparative semiconductor die 82, which can also mean that there is less need for cross-talk management or mitigation structures between the signal pathways 18, which may be required between the front-side signal pathways 96 and/or between the back-side signal pathways 100 (not shown in FIG. 2).

Figure 3:
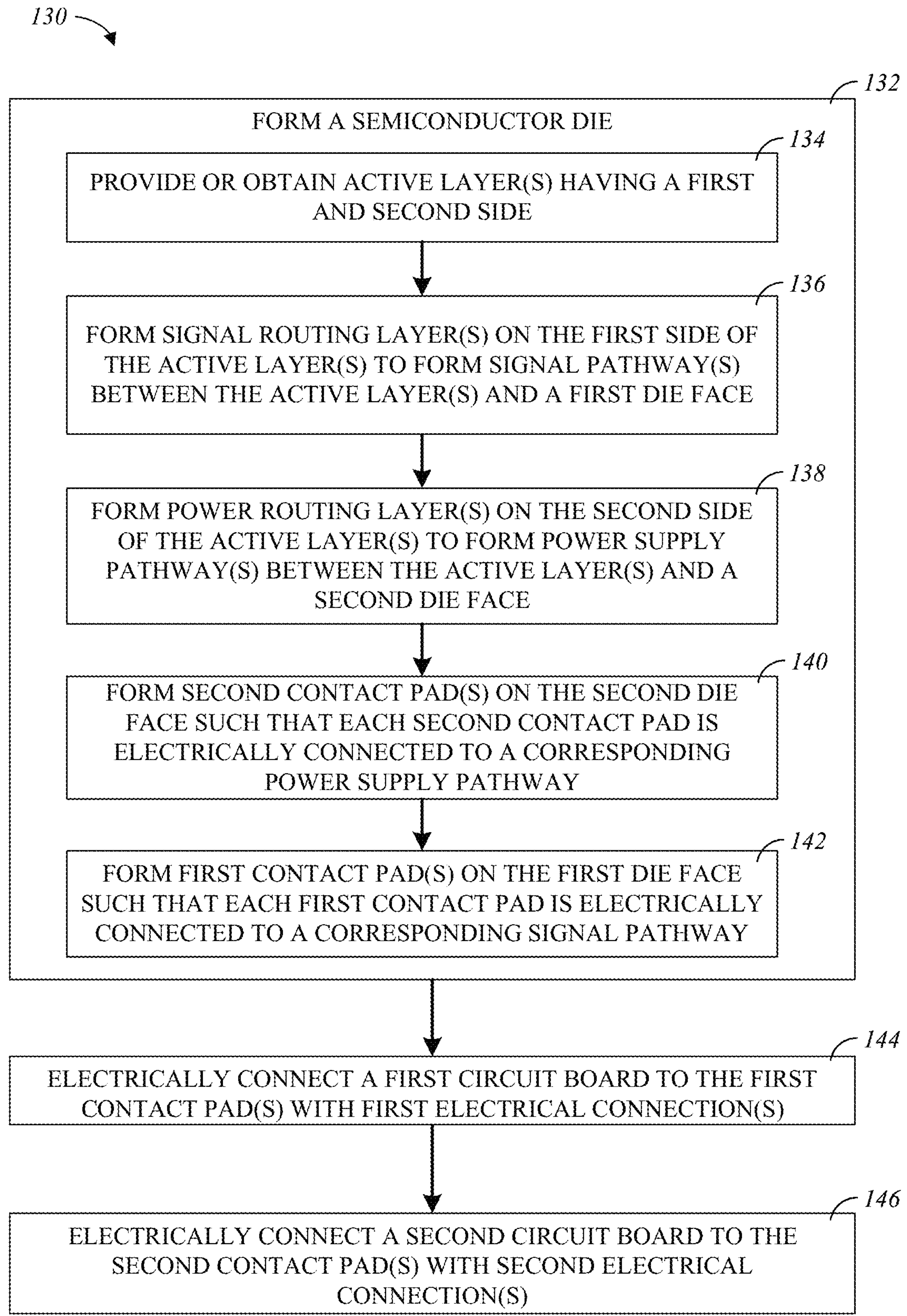
FIG. 3 is a flow diagram showing an example method of manufacturing an electronic device that includes a semiconductor die with dual-sided signal and electrical power routing, in accordance with some example embodiments.

FIG. 3 is a flow diagram of an example method 130 of manufacturing an electronic device that includes a dual-sided semiconductor die, such as the electronic device 10 with the semiconductor die 14 of FIG. 1. In an example, the method 130 includes, at step 132, forming a semiconductor die, which itself comprises a plurality of sub-steps. In an example, forming the semiconductor die (step 132) includes, at step 134, providing or obtaining one or more active layers having a first side and a second side opposing the first side (e.g., the active layer 16 in the semiconductor die 14, which has a "front side" and a "back side"). In an example, each of the one or more active layers of the semiconductor die include one or more transistors for performing one or more specified actions (such as the transistors 66 in the die 14).

Next, forming the semiconductor die (step 132 of the method 130) includes, at step 136, forming one or more signal routing layers on the first side of the one or more active layers (e.g., the signal routing layers 19 on the front side of the active layer 16 in the die 14 of FIG. 1). Forming the signal routing layers (step 136) results in the formation of one or more signal pathways (e.g., the signal pathways 18) between the one or more active layers and a first die face (e.g., the front face 20 of the die 14). In an example, forming the one or more signal routing layers (step 136) comprises depositing and metalizing the one or more signal routing layers to form one or more signal vias (e.g., the structures in the die 14 that form the signal pathways 18), wherein the one or more signal vias electrically connect the one or more first contact pads to the one or more active layers.

Forming the semiconductor die 14 (step 132 of the method 130) also includes, at step 138, forming one or more power routing layers on a second side of the one or more active layers (e.g., the power supply routing layers 23 on the back side of the active layer 16 in the die 14 of FIG. 1). In an example, forming the one or more power routing layers (step 138) results in the formation of one or more power supply pathways (e.g., the power supply pathways 22 in the die 14) between the one or more active layers and a second die face opposing the first die face (e.g., the back face 24 of the die 14). In an example, forming the one or more power routing layers (step 138) comprises depositing and metalizing the one or more power routing layers to form one or more power supply vias (e.g., the structures in the die 14 that form the power supply pathways 22), wherein the one or more power supply vias electrically connect the one or more second contact pads to the one or more active layers. Forming the one or more power routing layers (step 138) can be performed after step 136, before step 136, or concurrently or substantially concurrently with step 136.

Next, forming the semiconductor die (step 132 of the method 130) can include, at step 140, forming one or more second contact pads on the second die face (e.g., the power contact pads 28 on the back face 24 of the die 14) such that each second contact pad is electrically connected to a corresponding power pathway (e.g., each power contact pad 28 that is electrically connected to a corresponding power pathway 22 in the die 14). The electrical connection that is formed in step 140 can allow electrical power to be transmitted between the one or more second contact pads and the one or more active layers via the one or more power pathways (e.g., electrical power can be transmitted between the power contact pads 28 and the active layer 16 via the power pathways 22 in the die 14).

Forming the semiconductor die (step 132 of the method 130) can also include, at step 142, forming one or more first contact pads on the first die face (e.g., the power signal pads 26 on the front face 20 of the die 14) such that each first contact pad is electrically connected to a corresponding signal pathway (e.g., each signal contact pad 26 that is electrically connected to a corresponding signal pathway 18 in the die 14). The electrical connection that is formed in step 142 can allow one or more signals to be transmitted between the one or more first contact pads and the one or more active layers via the one or more signal pathways (e.g., one or more signals can be transmitted between the signal contact pads 26 and the active layer 16 via the signal pathways 18 in the die 14). Forming the one or more first contact pads (step 142) can be performed after step 140, before step 140, or concurrently or substantially concurrently with step 140.

Next, the method 130 can include, at step 144, electrically connecting a first circuit board (e.g., the signal circuit board 30 in the electronic device 10 of FIG. 1) to the one or more first contact pads of the semiconductor die formed in step 132 with one or more first electrical connections (e.g., with the signal interconnects 34, the signal interconnect pads 36, the substrate 42, the solder joints 44, and the substrate pads 46 that electrically connect the signal circuit board 30 to the signal contact pads 26 in the electronic device 10). The one or more first electrical connections formed in step 144 can transmit the one or more signals from the first circuit board to the one or more first contact pads (e.g., via the signal paths 68), i.e., so that the one or more signals can be transmitted to or from the one or more active layers via the one or more signal pathways. In an example, the one or more first electrical connections formed in step 144 include a substrate (e.g., the substrate 42 in the electronic device 10) electrically coupled to the first die face (e.g., the substrate 42 that is electrically coupled to the front face 20 with the one or more solder joints 44).

The method 130 can also include, at step 146, electrically connecting a second circuit board (e.g., the power circuit board 32 in the electronic device 10) to the one or more second contact pads of the semiconductor die formed in step 132 with one or more second electrical connections (e.g., the power interconnects 38 and power interconnect pads 40 that electrically connect the power circuit board 32 to the power contact pads 28 in the electronic device 10). The one or more second electrical connections formed in step 146 can transmit electrical power from the second circuit board to the one or more second contact pads (e.g., via the power supply paths 70), i.e., so that the electrical power can be transmitted to the one or more active layers via the one or more power supply pathways. In an example, the one or more second electrical connections formed in step 146 include a substrate (not shown in the electronic device 10 of FIG. 1, but similar to the substrate 42 but electrically coupled to the back face 24 of the semiconductor die 14) electrically coupled to the second die face (e.g., with solder joints that are similar or identical to the solder joints 44 that connect the substrate 42 to the front face 20). Electrically connecting the second circuit board to the one or more second contact pads (step 146) can be performed after step 144, before step 144, or concurrently or substantially concurrently with step 144.

The electronic device 10 described above with respect to FIG. 1 is a conventional electronic device wherein a plurality of semiconductor dies 14, 48 (at least one of which being the dual-sided semiconductor die 14 of the present disclosure) are connected substantially in the same two-dimensional plane. For example, the semiconductor dies 14, 48 shown in the electronic device 10 are both coupled to the same substrate 42 and are arranged generally in the same plane.

However, those having skill in the art will appreciate that the concept of the dual-sided semiconductor die of the present disclosure is not so limited. Rather, the dual-sided semiconductor die of the present disclosure can also be incorporated into an electronic device that utilizes three-dimensional stacking of semiconductor dies. As used herein, the term "three-dimensional," when referring to packaging and stacking of semiconductor dies in an electronic device, refer to at least one semiconductor die being positioned vertically above or below the plane of another one of the semiconductor dies in the device.

Figure 4:
FIG. 4 is a cross-sectional plan view of another electronic die package with a semiconductor die that includes dual-sided signal and electrical power routing, wherein the dual-sided semiconductor die is part of a three-dimensional stacking package, in accordance with some example embodiments.
Figure 4:
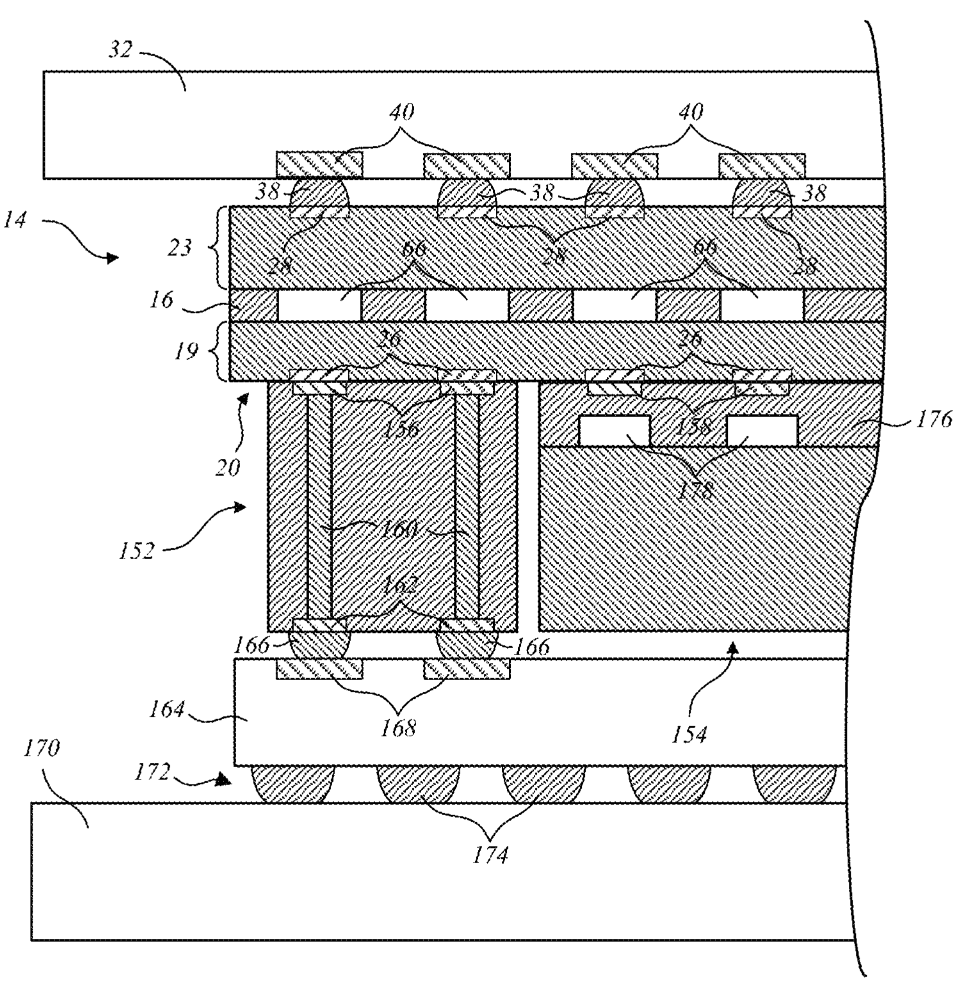

FIG. 4 shows a non-limiting example of a three-dimensional electronic device 150 (also referred to as the "3D electronic device 150") that incorporates a dual-sided semiconductor die, such as the semiconductor die 14 described above. For this reason, the dual-sided semiconductor die shown in FIG. 4 is designated with the same reference number 14 as is used for the semiconductor die 14 described above with respect to FIG. 1. Similarly, other structures of the semiconductor die 14 in FIG. 4 that can have the same or substantially the same configuration as the semiconductor die 14 in FIG. 1 are also given the same reference numbers. However, those having skill in the art will appreciate that the semiconductor die 14 in the three-dimensional electronic device 150 need not have the exact same structure as the semiconductor die 14 shown in FIG. 1. Also, not all of the structures shown for the die 14 in FIG. 1 are depicted in FIG. 4, but those having skill in the art will appreciate that just because a structure is not depicted in FIG. 4 does not mean that the die 14 does not necessarily have that structure. For example, the signal pathways 18 and the power supply pathways 22 are omitted from the depiction of FIG. 4 for the sake of simplicity, but would be present in reality in a three-dimensional device like the electronic device 150.

As shown in FIG. 4, in the 3D electronic device 150, the dual-sided semiconductor die 14 is located at a top side of the electronic device 150. The 3D electronic device 150 also includes two additional bottom-side dies 152, 154 located below the top-side semiconductor die 14. In the example shown, both bottom-side dies 152, 154 are electrically coupled to the bottom face 20 of the semiconductor die 14. In the example shown in FIG. 4, the electrical coupling between the top-side die 14 and the bottom-side dies 152, 154 are a hybrid bonding interconnect type of coupling, e.g., where the contact pads 26 on the bottom side 20 are directly bonded to corresponding contact pads 156 on the top side of die 152 and contact pads 158 on the top side of die 154.

In an example, a first bottom-side die 152 is a passive glass die 152 with no active structures. The passive glass die 152 includes through-glass vias 160 that extend from a top side of the die 152 to one or more contact pads 162 on a bottom side of the die 152. The bottom-side contact pads 162 can be electrically coupled to a bottom-side substrate 164, such as with solder joints 166 that are coupled to contact pads 168 on the substrate 164. The substrate 164 can be coupled to a bottom-side circuit board 170, such as with a ball grid array 172 comprising a plurality of solder ball joints 174. A second bottom-side die 154 can be one that includes an active layer 176, e.g., a layer 176 that includes one or more transistors 178. The active layer 176 can be configured, for example, as a cache so that the bottom-side die 154 is a cache die 154. Of course, those having skill in the art will appreciate that the bottom-side dies 152, 154 are not limited to the passive glass die 152 or the cache die 154 described above. Rather, those were merely examples of types of dies that could be stacked together with the dual-sided die 14 in a three-dimensional device 150. Similarly, while the dual-sided semiconductor die 14 is shown as being a top-side die in the three-dimensional stack of the example 3D electronic device 150 shown in FIG. 4, those having skill in the art will appreciate that the dual-sided die 14 could be a bottom-side die rather than a top-side die, and that one or both of the dies 152, 154 shown in FIG. 4 could be a top-side die rather than a bottom-side die.

Figure 5:
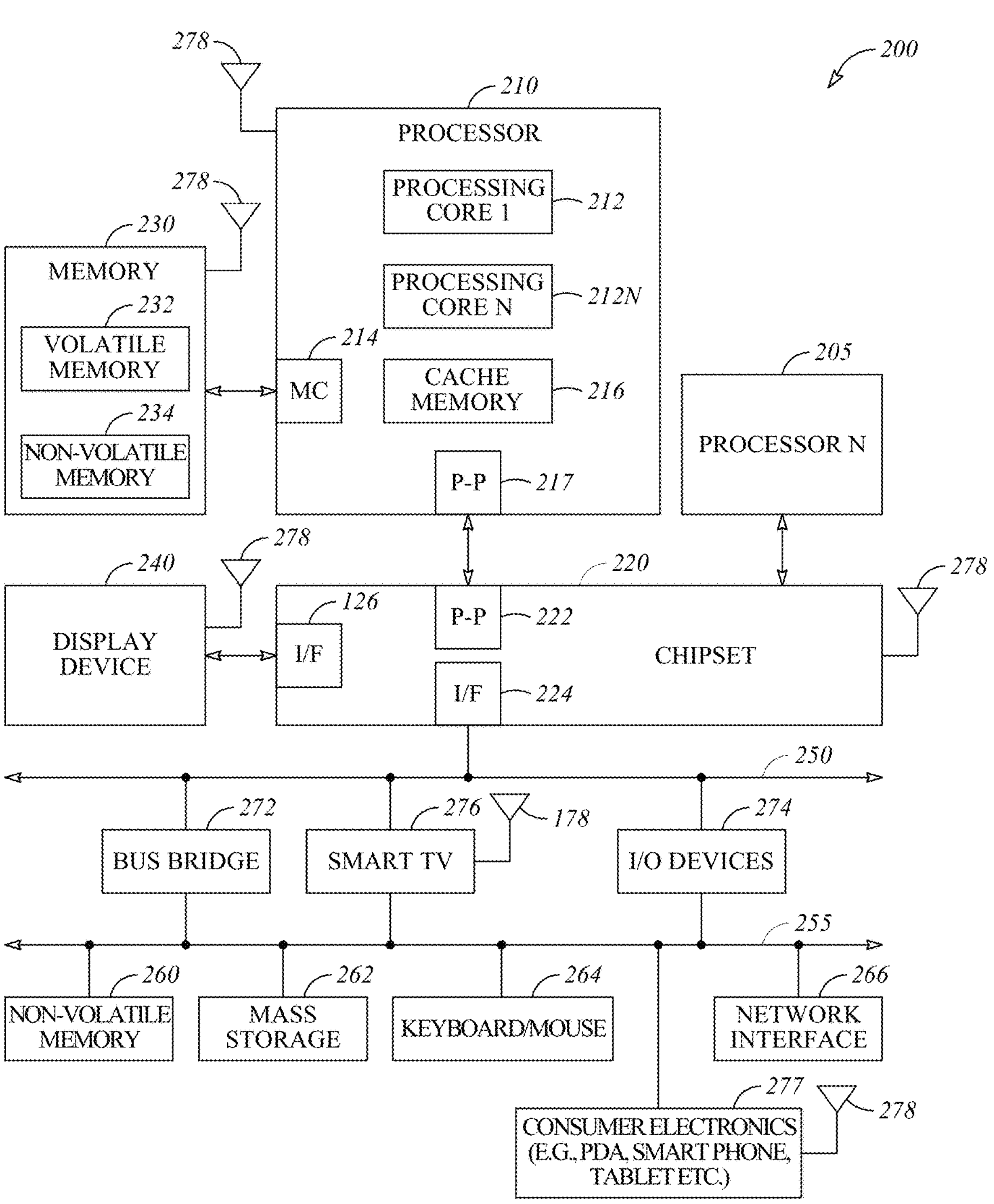
FIG. 5 is a system diagram depicting a system that may incorporate the example semiconductor die with dual-sided signal and electrical power routing and methods, in accordance with some example embodiments.

FIG. 5 illustrates a system level diagram, depicting an example of an electronic device (e.g., system) that may include a dual-sided semiconductor die and/or the methods described above. In one embodiment, the system 200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 200 includes a system on a chip (SOC) system.

In one embodiment, a processor 210 has one or more processor cores 212 and 212N, where 212N represents the Nth processor core inside the processor 210 where N is a positive integer. In one embodiment, the system 200 includes multiple processors including the processor 210 and processor 205, where processor 205 has logic similar or identical to the logic of processor 210. In some embodiments, the processing core 212 includes, but is not limited to, pre-fetch logic to fetch instructions, decode logic to decode the instructions, execution logic to execute instructions and the like. In some embodiments, the processor 210 has a cache memory 216 to cache instructions and/or data for the system 200. The cache memory 216 may be organized into a hierarchal structure including one or more levels of cache memory.

In some embodiments, the processor 210 includes a memory controller 214, which is operable to perform functions that enable the processor 210 to access and communicate with a memory 230 that includes a volatile memory 232 and/or a non-volatile memory 234. In some embodiments, the processor 210 is coupled with the memory 230 and a chipset 220. The processor 210 may also be coupled to a wireless antenna 278 to communicate with any device configured to transmit and/or receive wireless signals. In one embodiment, an interface for the wireless antenna 278 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, the volatile memory 232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. In some embodiments, the non-volatile memory 234 includes, but is not limited to, flash memory, phase change memory (PCM), read-only memory (ROM), electrically erasable programmable read-only memory (EEPROM), or any other type of non-volatile memory device.

The memory 230 stores information and instructions to be executed by the processor 210. In one embodiment, the memory 230 may also store temporary variables or other intermediate information while the processor 210 is executing instructions. In the illustrated embodiment, the chipset 220 connects with the processor 210 via Point-to-Point (PtP or P-P) interfaces 217 and 222. The chipset 220 enables the processor 210 to connect to other elements in the system 200. In some embodiments of the example system, the interfaces 217 and 222 operate in accordance with a PtP communication protocol such as the Intel® QuickPath Interconnect (QPI) or the like. In other embodiments, a different interconnect may be used.

In some embodiments, the chipset 220 is operable to communicate with the processor(s) 210, 205, a display device 240, and other devices, including a bus bridge 272, a smart TV 276, one or more I/O devices 274, a nonvolatile memory 260, a storage medium 262 (such as one or more mass storage devices), a keyboard/mouse 264, a network interface 266, and various forms of consumer electronics devices 277 (such as a PDA, a smart phone, a tablet etc.), etc. In one embodiment, the chipset 220 couples with these devices through an interface 224. The chipset 220 may also be coupled to a wireless antenna 278 to communicate with any device configured to transmit and/or receive wireless signals. In one example, any combination of components in a chipset may be separated by a continuous flexible shield as described in the present disclosure.

The chipset 220 connects to the display device 240 via an interface 226. The display device 240 may be, for example, a liquid crystal display (LCD), a light emitting diode (LED) array, an organic light emitting diode (OLED) array, or any other form of visual display device. In some embodiments of the example system, the processor 210 and the chipset 220 are merged into a single SOC. In addition, the chipset 220 can connect to one or more buses 250 and 255 that interconnect various system elements, such as the I/O devices 274, the nonvolatile memory 260, the storage medium 262, the keyboard/mouse 264, and the network interface 266. The buses 250 and 255 may be interconnected together via the bus bridge 272.

In one embodiment, the mass storage device 262 includes, but is not limited to, a solid state drive, a hard disk drive, a universal serial bus flash memory drive, or any other form of computer data storage medium. In one embodiment, the network interface 266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 5 are depicted as separate blocks within the system 200, the functions performed by some of these blocks may be integrated within a single semiconductor circuit or may be implemented using two or more separate integrated circuits. For example, although the cache memory 216 is depicted as a separate block within the processor 210, the cache memory 216 (or selected aspects of the cache memory 216) can be incorporated into a processor core 212, 212N.

To better illustrate the methods and apparatuses disclosed herein, a non-limiting list of exemplary embodiments are provided here:

EMBODIMENT 1 can include subject matter (such as an apparatus, a device, a method, or one or more means for performing acts), such as can include a die package comprising a semiconductor die comprising a first face on a first side of the semiconductor die, a second face on an opposing second side of the semiconductor die, one or more active layers located between the first face and the second face, one or more signal pathways between the first face and the one or more active layers, one or more power supply pathways between the second face and the one or more active layers, one or more first contact pads coupled to the first face, wherein each of the one or more signal pathways is electrically connected to a corresponding first contact pad, and wherein each signal pathway is configured to transmit one or more signals between the corresponding first contact pad and the one or more active layers, one or more second contact pads coupled to the second face, wherein each of the one or more power supply pathways is electrically connected to a corresponding second contact pad, and wherein each power supply pathway is configured to transmit electrical power from the corresponding second contact pad to the one or more active layers.

EMBODIMENT 2 can include, or can optionally be combined with the subject matter of EMBODIMENT 1, to optionally include a substrate electrically coupled to the first face or to the second face of the semiconductor die with one or more solder joints.

EMBODIMENT 3 can include, or can optionally be combined with the subject matter of EMBODIMENT 2, to optionally include each of the solder joints electrically coupling a corresponding solder pad on the substrate to a corresponding one of the one or more first contact pads and the substrate being configured to route the one or more signals to or from the semiconductor die via the one or more solder joints.

EMBODIMENT 4 can include, or can optionally be combined with the subject matter of EMBODIMENT 2, to optionally include each of the solder joints electrically coupling a corresponding solder pad on the substrate to a corresponding one of the one or more second contact pads and the substrate being configured to route the electrical power to the semiconductor die via the one or more solder joints.

EMBODIMENT 5 can include, or can optionally be combined with the subject matter of one or any combination of EMBODIMENTS 1-4, to optionally include the semiconductor die further comprising one or more signal routing layers located between the first face and the one or more active layers, wherein the one or more signal pathways are formed by the one or more signal routing layers.

EMBODIMENT 6 can include, or can optionally be combined with the subject matter of EMBODIMENT 5, to optionally include the one or more signal routing layers comprising one or more metalized signal routing layers that form one or more signal vias, wherein the one or more signal vias electrically connect the one or more first contact pads to the one or more active layers and provide the one or more signal pathways.

EMBODIMENT 7 can include, or can optionally be combined with the subject matter of one or any combination of EMBODIMENTS 1-6, to optionally include the semiconductor die further comprising one or more power routing layers located between the second face and the one or more active layers, wherein the one or more power supply pathways are formed by the one or more power routing layers.

EMBODIMENT 8 can include, or can optionally be combined with the subject matter of EMBODIMENT 7, to optionally include the one or more power routing layers comprising one or more metalized power routing layers that form one or more power supply vias, wherein the one or more power supply vias electrically connect the one or more second contact pads to the one or more active layers.

EMBODIMENT 9 can include, or can optionally be combined with the subject matter of one or any combination of EMBODIMENTS 1-8, to optionally include the one or more active layers comprising one or more transistors configured to perform one or more actions, wherein the one or more signal pathways and the one or more power supply pathways are electrically connected to the one or more transistors.

EMBODIMENT 10 can include, or can optionally be combined with the subject matter of one or any combination of EMBODIMENTS 1-9, to optionally include the first face being planar or substantially planar.

EMBODIMENT 11 can include, or can optionally be combined with the subject matter of one or any combination of EMBODIMENTS 1-10, to optionally include the second face being planar or substantially planar.

EMBODIMENT 12 can include, or can optionally be combined with the subject matter of one or any combination of EMBODIMENTS 1-11, to include subject matter (such as an apparatus, a device, a method, or one or more means for performing acts), such as can include an electronic device comprising a first circuit board, a second circuit board spaced from the first circuit board, and a die package located between the first circuit board and the second circuit board, wherein the die package is coupled to the first circuit board with one or more first interconnects and is coupled to the second circuit board with one or more second interconnects. The die package comprises a semiconductor die including a first face on a first side of the semiconductor die, a second face on an opposing second side of the semiconductor die, one or more active layers located between the first face and the second face, one or more signal pathways between the first face and the one or more active layers, one or more power supply pathways between the second face and the one or more active layers, one or more first contact pads coupled to the first face, wherein each of the one or more first contact pads is electrically connected to a corresponding one of the one or more first interconnects, and one or more second contact pads coupled to the second face, wherein each of the one or more second contact pads is electrically connected to a corresponding one of the one or more second interconnect. Each of the one or more signal pathways is electrically connected to a corresponding first contact pad such that each signal pathway transmits one or more signals between the corresponding first contact pad and the one or more active layers. Each of the one or more power supply pathways is electrically connected to a corresponding second contact pad such that each power supply pathway transmits electrical power from the corresponding second contact pad to the one or more active layers. The first circuit board is configured to route the one or more signals to the one or more first interconnects and the second circuit board is configured to route the electrical power to the one or more second interconnects. The electronic device further includes one or more first electrical connections between the one or more first interconnects and the one or more first contact pads such that the one or more signals are transmitted from the one or more first interconnects to the one or more signal pathways via the one or more first electrical connections and the one or more first contact pads, and one or more second electrical connections between the one or more second interconnects and the one or more second contact pads such that the electrical power is transmitted from the one or more second interconnects to the one or more power supply pathways via the one or more second electrical connections and the one or more second contact pads.

EMBODIMENT 13 can include, or can optionally be combined with the subject matter of EMBODIMENT 12, to optionally include the die package further including a substrate.

EMBODIMENT 14 can include, or can optionally be combined with the subject matter of EMBODIMENT 13, to optionally include the substrate being electrically coupled to the first face of the semiconductor die such that the one or more first electrical connections between the one or more first. interconnects and the one or more first contact pads are through the substrate EMBODIMENT 15 can include, or can optionally be combined with the subject matter of EMBODIMENT 13, to optionally include the substrate being electrically coupled to the second face of the semiconductor die such that the one or more second electrical connections between the one or more second interconnects and the one or more second contact pads are through the substrate.

EMBODIMENT 16 can include, or can optionally be combined with the subject matter of one or any combination of EMBODIMENTS 12-15, to optionally include the semiconductor die being arranged in a three-dimensional die stack such that the electronic device is a three-dimensional electronic device.

EMBODIMENT 17 can include, or can optionally be combined with the subject matter of one or any combination of EMBODIMENTS 12-16, to optionally include the semiconductor die further comprising one or more signal routing layers located between the first face and the one or more active layers, wherein the one or more signal pathways are formed by the one or more signal routing layers.

EMBODIMENT 18 can include, or can optionally be combined with the subject matter of one or any combination of EMBODIMENTS 12-17, to optionally include the semiconductor die further comprising one or more power routing layers located between the second face and the one or more active layers, wherein the one or more power supply pathways are formed by the one or more power routing layers.

EMBODIMENT 19 can include, or can optionally be combined with the subject matter of one or any combination of EMBODIMENTS 12-18, to optionally include the one or more active layers comprising one or more transistors configured to perform one or more actions, wherein the one or more signal pathways and the one or more power supply pathways are electrically connected to the one or more transistors.

EMBODIMENT 20 can include, or can optionally be combined with the subject matter of one or any combination of EMBODIMENTS 12-19, to optionally include the first face of the semiconductor die being planar or substantially planar.

EMBODIMENT 21 can include, or can optionally be combined with the subject matter of one or any combination of EMBODIMENTS 12-20, to optionally include the second face of the semiconductor die being planar or substantially planar.

EMBODIMENT 22 can include, or can optionally be combined with the subject matter of one or any combination of EMBODIMENTS 1-21, to include subject matter (such as an apparatus, a device, a method, or one or more means for performing acts), such as can include a method of manufacturing a die package, the method comprising forming a semiconductor die, wherein forming the semiconductor die comprises providing or obtaining one or more active layers having a first side and a second side opposing the first side, forming one or more signal routing layers on the first side of the one or more active layers, wherein the one or more signal routing layers form one or more signal pathways between the one or more active layers and a first face of the semiconductor die, forming one or more power routing layers on a second side of the one or more active layers, wherein the one or more power routing layers form one or more power supply pathways between the one or more active layers and a second face of the semiconductor die, wherein the second face of the semiconductor die opposes the first face, forming one or more first contact pads on the first face of the semiconductor die so that each of the one or more first contact pads is electrically connected to a corresponding signal pathway such that one or more signals can be transmitted between the one or more first contact pads and the one or more active layers via the one or more signal pathways, and forming one or more second contact pads on the second face of the semiconductor die so that each of the one or more second contact pads is electrically connected to a corresponding power supply pathway such that electrical power can be transmitted from the one or more second contact pads to the one or more active layers via the one or more power supply pathways.

EMBODIMENT 23 can include, or can optionally be combined with the subject matter of EMBODIMENT 22, to optionally include coupling a substrate to the semiconductor die with one or more solder joints.

EMBODIMENT 24 can include, or can optionally be combined with the subject matter of EMBODIMENT 23, to optionally include the coupling of the substrate to the semiconductor die comprising electrically coupling a solder pad on the substrate to a corresponding first contact pad with a corresponding one of the one or more solder joints.

EMBODIMENT 25 can include, or can optionally be combined with the subject matter of EMBODIMENT 23, to optionally include the coupling of the substrate to the semiconductor die comprising electrically coupling a solder pad on the substrate to a corresponding second contact pad with a corresponding one of the one or more solder joints.

EMBODIMENT 26 can include, or can optionally be combined with the subject matter of one or any combination of EMBODIMENTS 22-25, to optionally include electrically connecting a first circuit board to the one or more first contact pads of the semiconductor die with one or more first electrical connections, wherein the one or more first electrical connections can transmit the one or more signals from the first circuit board to the one or more first contact pads.

EMBODIMENT 27 can include, or can optionally be combined with the subject matter of EMBODIMENT 26, to optionally include the one or more first electrical connections comprising a first substrate coupled to the first face of the semiconductor die and to the first circuit board.

EMBODIMENT 28 can include, or can optionally be combined with the subject matter of one or any combination of EMBODIMENTS 22-28, to optionally include electrically connecting a second circuit board to the one or more second contact pads of the semiconductor die with one or more second electrical connections, wherein the one or more second electrical connections can transmit the electrical power from the first circuit board to the one or more second contact pads.

EMBODIMENT 29 can include, or can optionally be combined with the subject matter of EMBODIMENT 28, to optionally include the one or more second electrical connections comprising a second substrate coupled to the second face of the semiconductor die and to the second circuit board.

EMBODIMENT 30 can include, or can optionally be combined with the subject matter of one or any combination of EMBODIMENTS 22-29, to optionally include the forming of the one or more signal routing layers comprising depositing and metalizing the one or more signal routing layers to form one or more signal vias, wherein the one or more signal vias electrically connect the one or more first contact pads to the one or more active layers and provide the one or more signal pathways.

EMBODIMENT 31 can include, or can optionally be combined with the subject matter of one or any combination of EMBODIMENTS 22-30, to optionally include the forming of the one or more power routing layers comprising depositing and metalizing the one or more power routing layers to form one or more power supply vias, wherein the one or more power supply vias electrically connect the one or more second contact pads to the one or more active layers and provide the one or more power supply pathways.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An apparatus, comprising:

a first circuit board;

a second circuit board; and a die package between the first circuit board and the second circuit board, the die package comprising:

a package substrate having a bottom surface coupled to a top surface of the second circuit board by a first interconnect therebetween;

a first semiconductor die coupled to a top surface of the package substrate, the first semiconductor die comprising a first face on a first side of the first semiconductor die, a second face on an opposing second side of the first semiconductor die, an active layer between the first face and the second face, a first electrical pathway between the first face and the active layer, a second electrical pathway between the second face and the active layer, a first contact pad adjacent the first side and coupled to the first electrical pathway and to the first circuit board by a second interconnect therebetween, and a second contact pad adjacent the second side and coupled to the second electrical pathway and to the package substrate by a third interconnect therebetween; and a second semiconductor die coupled to the top surface of the package substrate, wherein the first electrical pathway is to transmit power from the first circuit board to the active layer, the second electrical pathway is to transmit signals from the package substrate to the active layer, the first face carries only power contact pads and is free of signal contact pads, the second face carries only signal contact pads and is free of power contact pads, the first electrical pathway and the second electrical pathway each comprise routing layers between the respective face and the active layer without extending through the active layer.

2. The apparatus of claim 1, wherein the first interconnect, the second interconnect, and the third interconnect comprise solder joints.

3. The apparatus of claim 2, wherein the solder joints of the first interconnect, the second interconnect, and the third interconnect are coupled to corresponding contact pads of the second circuit board, the first circuit board, and the package substrate, respectively.

4. The apparatus of claim 3, further comprising a second solder joint between the second semiconductor die and the package substrate.

5. The apparatus of claim 1, wherein the routing layers comprise one or more first routing layers between the first face and the active layer, wherein the first electrical pathway is formed by the one or more first routing layers, and the one or more first routing layers contact a top of the active layer.

6. The apparatus of claim 5, wherein the one or more first routing layers comprise one or more first metalized layers that form a first via, wherein the first via electrically connects the first contact pad to the active layer and provides the first electrical pathway.

7. The apparatus of claim 5, wherein the routing layers comprise one or more second routing layers between the second face and the active layer, the one or more second routing layers contact a bottom of the active layer, and the second electrical pathway is formed by the one or more second routing layers.

8. The apparatus of claim 7, wherein the one or more second routing layers comprise one or more second metalized layers that form a second via, wherein the second via electrically connects the second contact pad to the active layer and provides the second electrical pathway.

9. The apparatus of claim 1, wherein the active layer comprises a transistor, and the first electrical pathway and the second electrical pathway are electrically connected to opposite sides of the transistor.

10. An apparatus, comprising:

a first circuit board;

a second circuit board; and a die package between the first circuit board and the second circuit board, the die package comprising:

a package substrate having a bottom surface coupled to a top surface of the second circuit board by a first interconnect therebetween;

a first semiconductor die coupled to a top surface of the package substrate, the first semiconductor die comprising an active layer between a first face and a second opposing face of the first semiconductor die, a metalized signal dedicated pathway between the first face and the active layer and contacting a first side of the active layer, a metalized power dedicated pathway between the second face and the active layer and contacting a first side of the active layer, a first contact pad adjacent the first face and coupled to the metalized signal dedicated pathway and to the first circuit board by a second interconnect therebetween, and a second contact pad adjacent the second face and coupled to the metalized power dedicated pathway and to the package substrate by a third interconnect therebetween, wherein neither the metalized signal dedicated pathway nor the metalized power dedicated pathway extend through the active layer; and a second semiconductor die coupled to the top surface of the package substrate and laterally adjacent the first semiconductor die.

11. The apparatus of claim 10, wherein the first interconnect, the second interconnect, and the third interconnect comprise solder joints.

12. The apparatus of claim 11, wherein the solder joints of the first interconnect, the second interconnect, and the third interconnect are coupled to corresponding contact pads of the second circuit board, the first circuit board, and the package substrate, respectively.

13. The apparatus of claim 12, further comprising a second solder joint between the second semiconductor die and the package substrate.

14. The apparatus of claim 10, wherein the first semiconductor die further comprises one or more first routing layers between the first face and the active layer, wherein the metalized signal pathway is formed by the one or more first routing layers.

15. The apparatus of claim 14, wherein the one or more first routing layers comprise one or more first metalized layers that form a first via, wherein the first via electrically connects the first contact pad to the active layer and provides the metalized signal pathway.

16. The apparatus of claim 10, wherein the first semiconductor die further comprises one or more second routing layers between the second face and the active layer, wherein the metalized power pathway is formed by the one or more second routing layers.

17. The apparatus of claim 16, wherein the one or more second routing layers comprise one or more second metalized layers that form a second via, wherein the second via electrically connects the second contact pad to the active layer and provides the metalized power pathway.

18. The apparatus of claim 10, wherein the active layer comprises a transistor, and the metalized signal pathway and metalized power pathway are electrically connected to the transistor.

19. An apparatus, comprising:

a first circuit board;

a second circuit board; and a die package between the first circuit board and the second circuit board, the die package comprising:

a package substrate having a bottom surface coupled to a top surface of the second circuit board by a first interconnect therebetween;

a first die coupled to a top surface of the package substrate, the first die comprising a first face on a first side of the first die, a second face on an opposing second side of the first die, an active layer between the first face and the second face, a first electrical pathway between the first face and the active layer, a second electrical pathway between the second face and the active layer, a first contact pad adjacent the first side and coupled to the first electrical pathway and to the first circuit board by a second interconnect therebetween, and a second contact pad adjacent the second side and coupled to the second electrical pathway and to the package substrate by a through via extending through a second die therebetween; and a third die adjacent the top surface of the package substrate and laterally adjacent the second die, wherein the first electrical pathway is to transmit power from the first circuit board to the active layer, the second electrical pathway is to transmit signals from the package substrate to the active layer, the first face carries only power contact pads and is free of signal contact pads, the second face carries only signal contact pads and is free of power contact pads, the first electrical pathway and the second electrical pathway each comprise routing layers between the respective face and the active layer without extending through the active layer.

20. The apparatus of claim 19, wherein the first interconnect and the second interconnect comprise solder joints.

21. The apparatus of claim 20, wherein the solder joints of the first interconnect and the second interconnect are coupled to corresponding contact pads of the second circuit board and the first circuit board, respectively.

22. The apparatus of claim 19, wherein the first die is coupled to the second die by a hybrid bond therebetween.

23. The apparatus of claim 19, wherein the routing layers comprise one or more first routing layers between the first face and the active layer, wherein the first electrical pathway is formed by the one or more first routing layers, and the one or more first routing layers contact a top of the active layer.

24. The apparatus of claim 23, wherein the one or more first routing layers comprise one or more first metalized layers that form a first via, wherein the first via electrically connects the first contact pad to the active layer and provides the first electrical pathway.

25. The apparatus of claim 23, wherein the routing layers comprise one or more second routing layers between the second face and the active layer, the one or more second routing layers contact a bottom of the active layer, and the second electrical pathway is formed by the one or more second routing layers.

26. The apparatus of claim 25, wherein the one or more second routing layers comprise one or more second metalized layers that form a second via, wherein the second via electrically connects the second contact pad to the active layer and provides the second electrical pathway.

27. The apparatus of claim 19, wherein the active layer comprises a transistor, and the first electrical pathway and the second electrical pathway are electrically connected to opposite sides of the transistor.

* * * * *